(12) United States Patent
Wang et al.

(10) Patent No.: US 8,274,793 B2
(45) Date of Patent: *Sep. 25, 2012

(54) HEATSINK MOUNTING SYSTEM

(75) Inventors: Fang Wang, San Ramon, CA (US);
Thierry Sin Yan Too, San Ramon, CA (US); Jim Moore, Los Gatos, CA (US);
Mong Hu, San Jose, CA (US)

(73) Assignee: Intricast Company, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/870,605

(22) Filed: Aug. 27, 2010

(65) Prior Publication Data

US 2010/0321894 A1    Dec. 23, 2010

Related U.S. Application Data

(63) Continuation-in-part of application No. 12/342,273, filed on Dec. 23, 2008, now Pat. No. 7,848,107.

(51) Int. Cl.
*H05K 7/20* (2006.01)
(52) U.S. Cl. ........ 361/709; 361/710; 361/715; 165/121; 257/727
(58) Field of Classification Search ............. 361/679.54, 361/697, 704, 709, 710, 715, 719
See application file for complete search history.

(56) References Cited

U.S. PATENT DOCUMENTS

| | | | | |
|---|---|---|---|---|
| 5,495,392 A * | 2/1996 | Shen | | 361/697 |
| 5,677,829 A * | 10/1997 | Clemens | | 361/697 |
| 5,828,550 A * | 10/1998 | Horng | | 361/697 |
| 6,343,013 B1 * | 1/2002 | Chen | | 361/695 |
| 6,392,885 B1 * | 5/2002 | Lee et al. | | 361/697 |
| 6,707,674 B1 * | 3/2004 | Bryant et al. | | 361/704 |
| 7,606,028 B2 * | 10/2009 | Liu | | 361/697 |
| 7,619,892 B2 * | 11/2009 | Liang | | 361/707 |
| 7,848,107 B2 * | 12/2010 | Wang et al. | | 361/704 |
| 8,125,782 B2 * | 2/2012 | Azar et al. | | 361/709 |
| 2003/0103332 A1 * | 6/2003 | Sopko et al. | | 361/704 |
| 2009/0040729 A1 * | 2/2009 | Deng et al. | | 361/710 |

\* cited by examiner

*Primary Examiner* — Courtney Smith
(74) *Attorney, Agent, or Firm* — Michael J. Hughes

(57) ABSTRACT

A heatsink mounting system (10) is provided for containing and engaging a heatsink (16) against a heat generating component, typically an IC chip (18). The system (10) is includes a rectangular integrally formed resilient frame (12) defining a cavity (26) in which the heatsink (16) is contained. The frame (12) includes a pair of opposed lateral sides (30) and a pair of opposing gripping sides (28) with L-shaped corner blocks (32) depending from the intersections thereof. The gripping sides (28) include centrally positioned grip handles (38) with curved handle posts (39) extending upward and grip blocks (34) depending therefrom, each grip block (34) having a grip tongue (36) at the lower extent thereof extending inward into the cavity (26). Inward pressure on the grip handles (38) forces the grip tongues (36) outward to release objects captured thereby.

11 Claims, 5 Drawing Sheets

HEATSINK MOUNTING SYSTEM

This is a Continuation-In-Part patent application based in part upon, and claims priority from, copending U.S. patent application Ser. No. 12/342,273 filed 23 Dec. 2008 by the same inventors.

TECHNICAL FIELD

The present invention relates generally to semiconductor cooling methods and more specifically to a releasable mounting system for mounting heatsink elements onto semiconductor chips mounted on or in planar carriers.

BACKGROUND ART

Many electronic components such as IC chips require cooling structures such as heatsinks to conduct and radiate heat away from the electronic components. Conductive heatsink components, which come in a wide variety of forms, must be held against the surface of the chips in order to function effectively. However, it is often desirable to mount the heatsink in a removable manner. Consequently, a need exists to provide economical, simple and stable systems for mounting the heatsinks on the chips and boards.

An example of a stable and adjustable heatsink mount is found in U.S. Pat. No. 5,932,925 to Gerald McIntyre, assigned to Intricast, Inc. of Santa Clara, Calif. This patent shows a novel method of providing a resilient adjustable pressure to the heatsink in order to maintain it in abutment against the semiconductor such that maximum conductive heat transfer may occur. Other heatsink mount inventions may be found in U.S. Pat. Nos. 6,476,484 and 6,644,396.

There remains a need for heatsink mounting systems for electronic components which are readily attachable and detachable, while maintaining good heat transfer. Accordingly, there is a need in the industry for a system such as the presently preferred invention.

DISCLOSURE OF INVENTION

Accordingly, it is an object of the present invention to provide a system for mounting a heatsink device on a semiconductor chip or chip board which is easily attached and removed.

Another object of the invention of the present invention is to provide a single integrated heatsink mount which provides constant resilient pressure on the heatsink in order to maintain minimum pressure and thermally conductive contact with the electronic component.

An additional object of the invention is to provide a heatsink and carrier which are in the form of a loosely pre-assembled unit which may simply be clipped onto a chip package for quick installation.

Yet another object of the invention is to provide a heatsink mounting system which does not require any modifications to the circuit board upon which the chip is secured.

Still another object of the invention is to provide a heatsink mount which frames both the heatsink itself and the chip package at all four corners to maintain stable centering and contact.

Briefly, one presently preferred embodiment of the present invention is a heatsink mount adapted to releasably secure a heatsink to the surface of a generally rectangular electronic component. The mount system includes a resilient open frame having opposed lateral sides and gripping sides, with each corner apex being provided with L-shaped corner retaining blocks for positioning the heatsink. The gripping sides have grip blocks depending therefrom to extend below the edges of the chip/board, with each grip block including a grip tongue for extending beneath the edge of the chip/board to secure the mount and heatsink thereto. When not engaged with the chip/board the grip blocks capture the heatsink member. Each gripping side further includes a grip handle such that the opposed grip handles may be squeezed together to torque the resilient frame and cause the grip tongues to spread apart, thus allowing installation on or removal of the mounting system from the chip/board. A resilient recurve spring member is provided to extend across the frame to engage spring capture protrusions on the exterior of the frame. The recurve spring extends downward in its center extent to engage the heatsink and provide pressure thereto to maintain contact with the grip blocks prior to engagement and with the chip when the assembly is engaged.

An advantage of the present invention is that the heatsink mount may be easily installed and removed using only finger pressure.

Another advantage of the present invention is that no modification to the chip package is ordinarily needed to facilitate mounting and in particular that no additional holes need be provided on the circuit board.

A further advantage of the present invention is that the heatsink is laterally positioned by the retaining corner blocks to maintain optimal contact with the chip member.

Yet another advantage of the present invention is that the securing provided by the grip tongues does not work loose during ordinary usage.

A further advantage of the present invention is that the use of a metal spring element provides greater durability and consistency during use since the metal deforms less with heat and retains resiliency better than plastics.

A further advantage of the present invention is that is it easily disengaged from the chip using only two fingers.

Yet another advantage of the presently preferred invention is that the external spring mount provides inward pressure on the clip member to further secure the mounting in position.

These and other objects and advantages of the present invention will become clear to those skilled in the art in view of the description of the best presently known modes of carrying out the invention and the industrial applicability of the preferred embodiments as described herein and as illustrated in the several figures of the drawings.

BRIEF DESCRIPTION OF THE DRAWINGS

The purposes and advantages of the present invention will be apparent from the following detailed description in conjunction with the appended drawings in which.

BEST MODE FOR CARRYING OUT THE INVENTION

Figure 1:
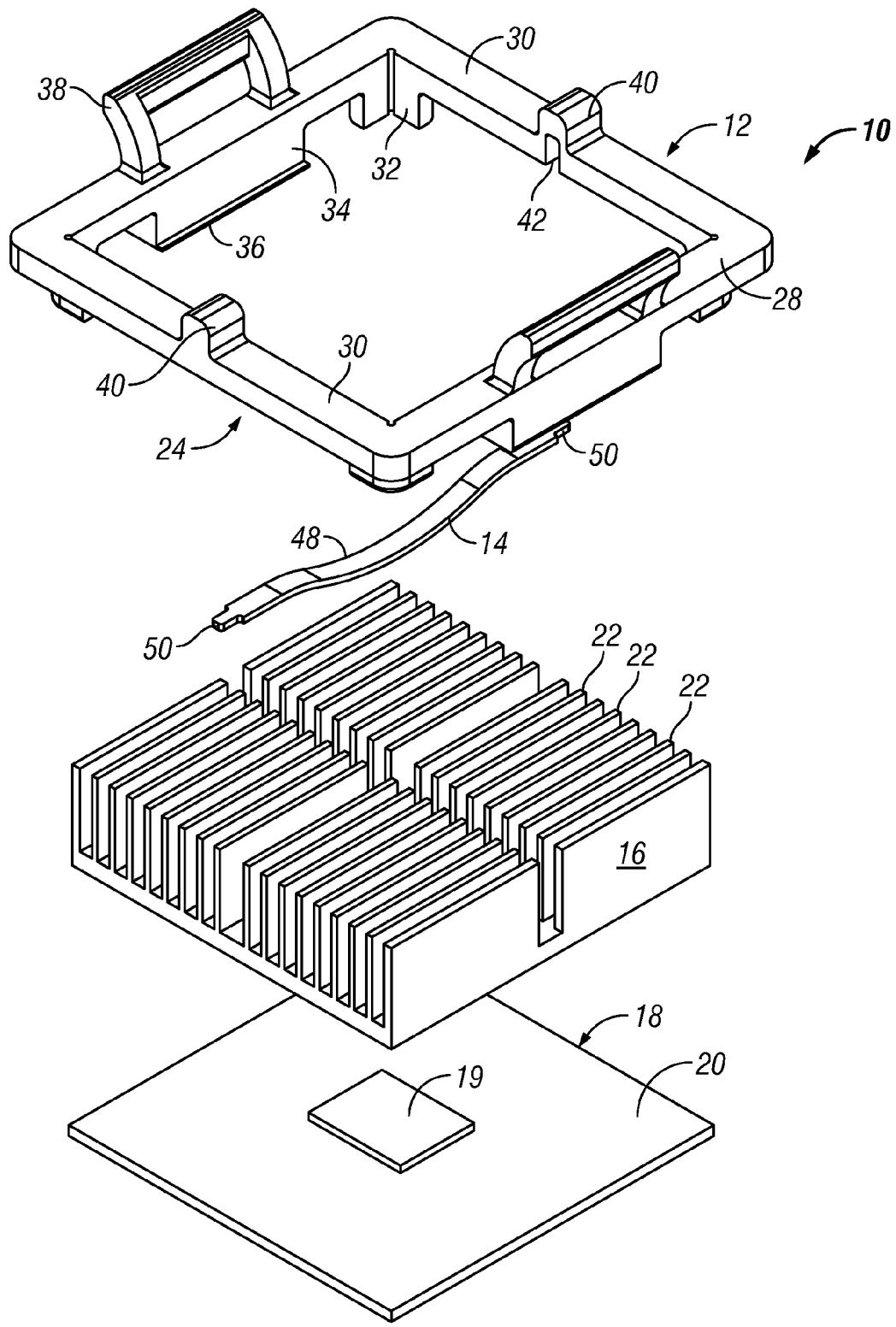
FIG. 1 is an exploded perspective view of a previously disclosed embodiment of the present invention, including illustration of a semiconductor chip and a typical heatsink used therewith.
Figure 2:
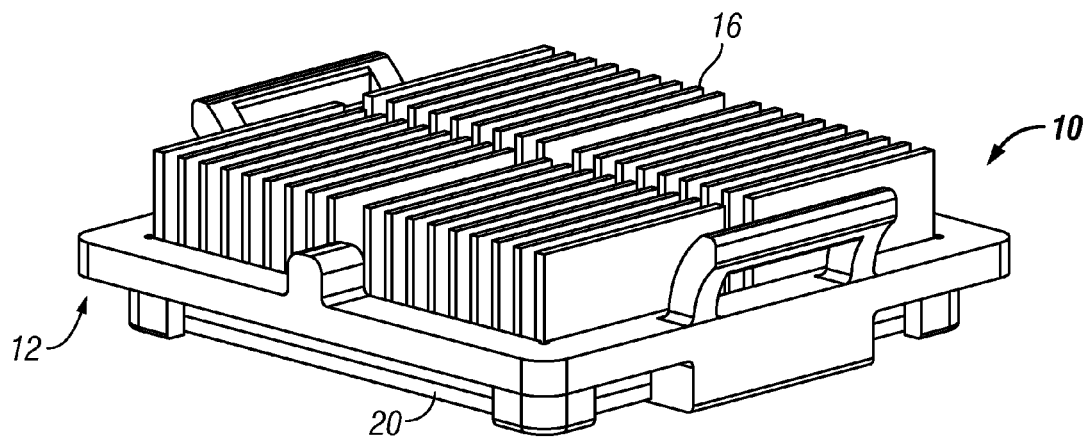
FIG. 2 is a perspective view of the heatsink mounting system of FIG. 1, shown with a heatsink therewithin.
Figure 3:
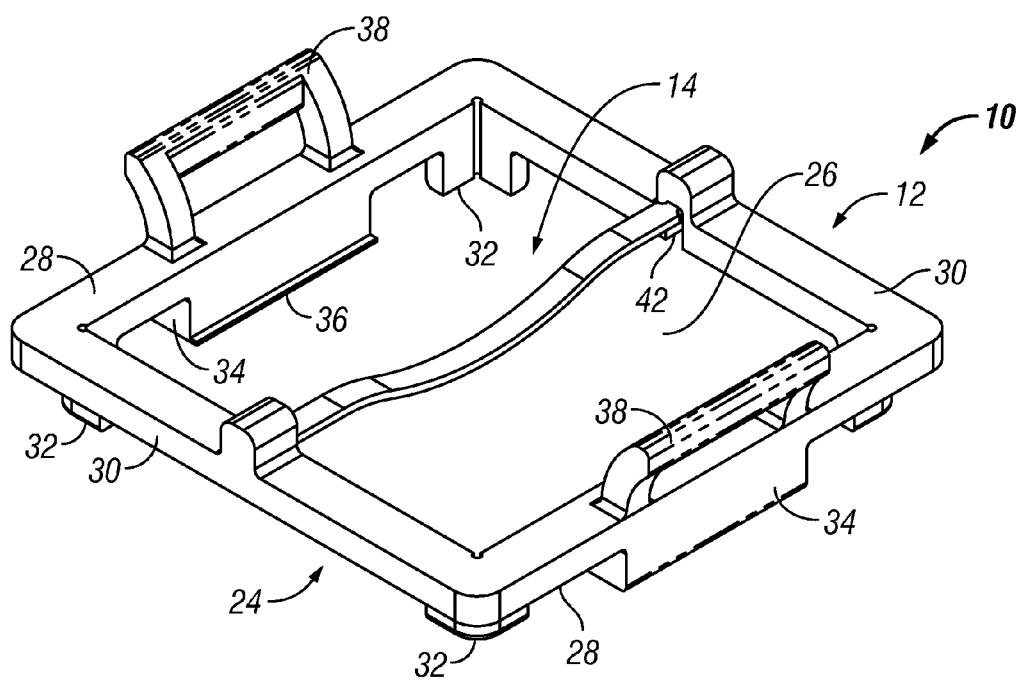
FIG. 3 is a further perspective view showing only the inventive components of the heatsink mounting system of FIG. 1.
Figure 4:
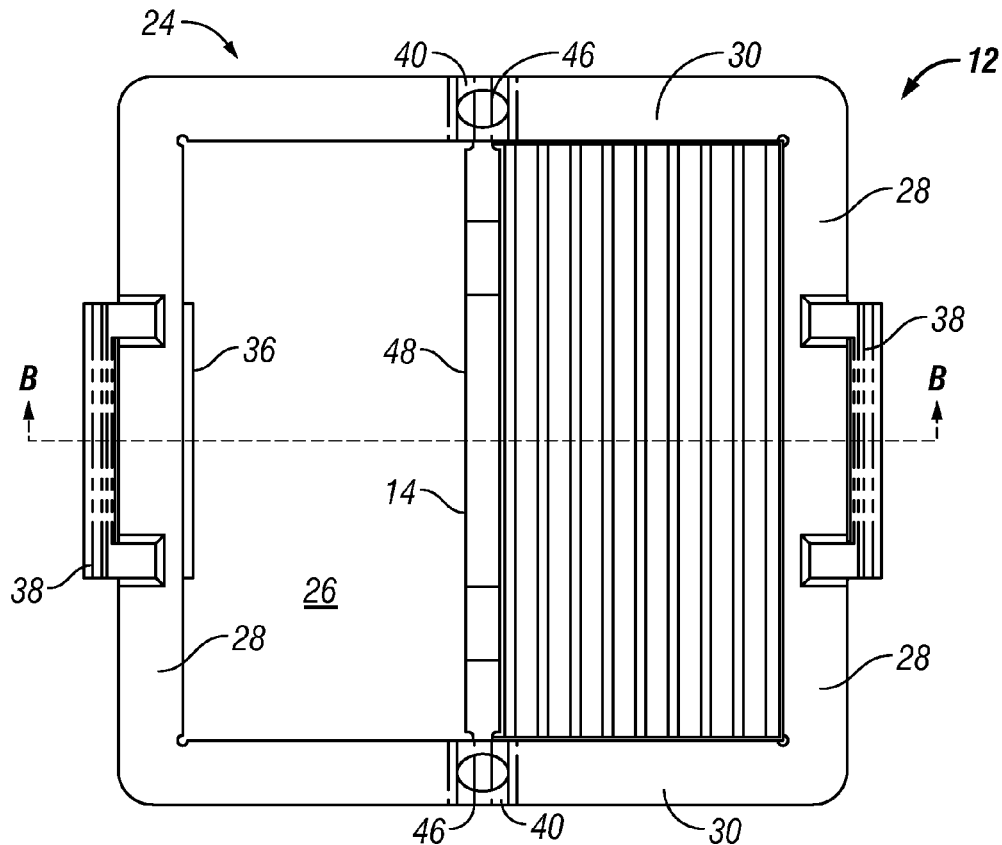
FIG. 4 is a top plan view of the heat sink mounting system of FIG. 1, showing a heatsink mounted in one-half of the system only for illustration purposes and also illustrating an alternate embodiment.
Figure 6:
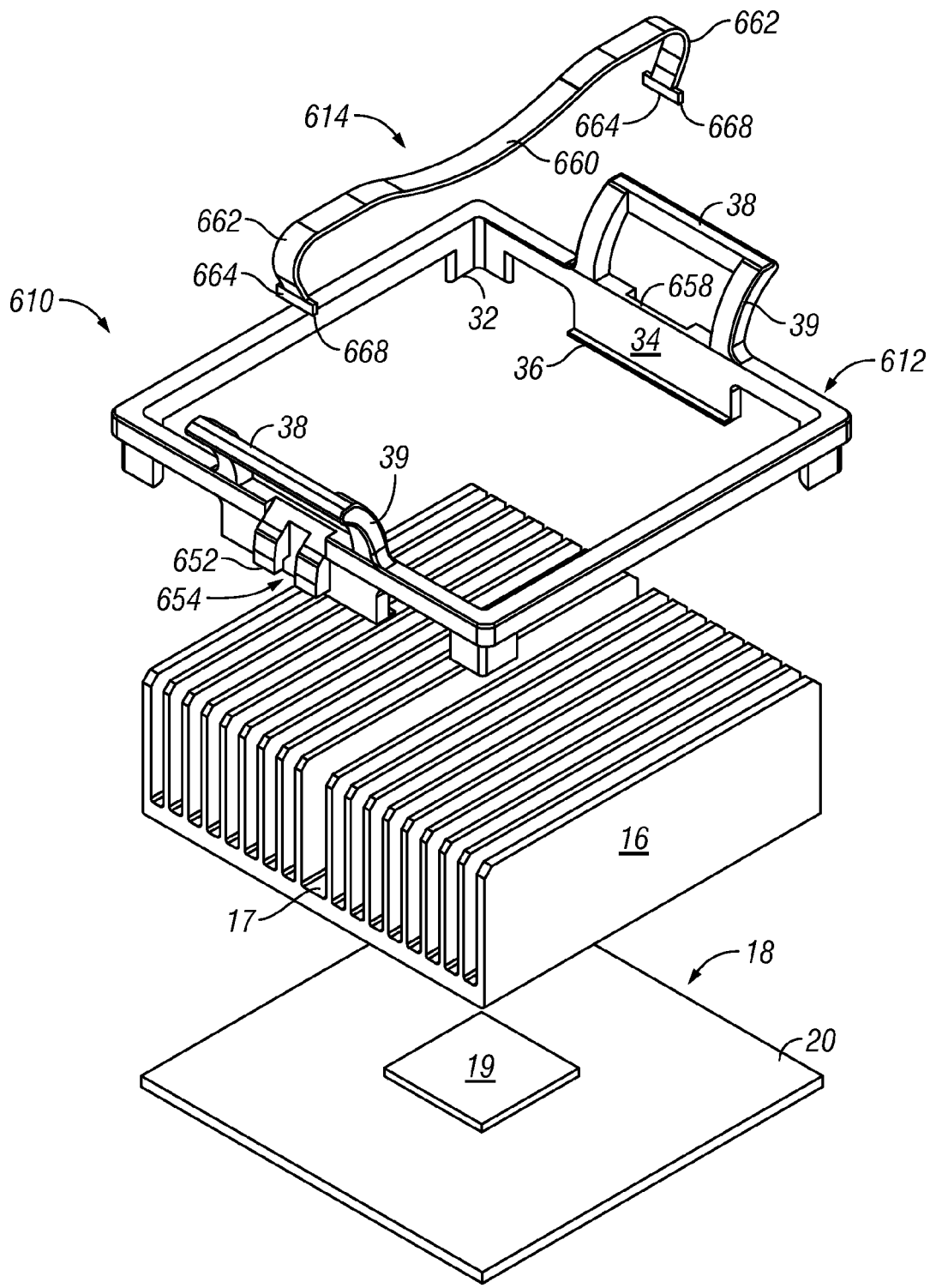
FIG. 6 is an exploded perspective view of the presently preferred embodiment of the improved heatsink mounting system of the invention.
Figure 7:
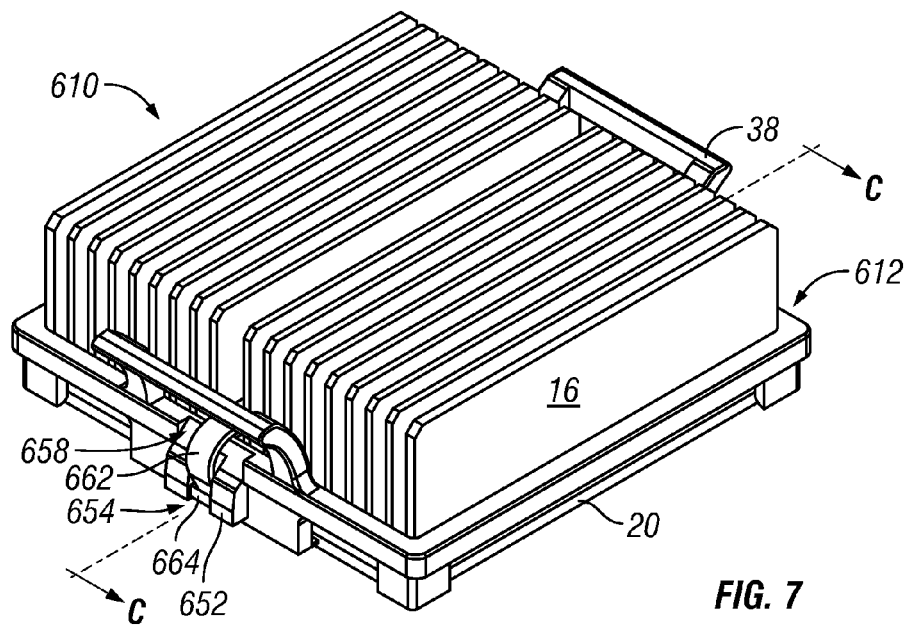
FIG. 7 is a perspective of the embodiment of FIG. 6, shown fully engaged.
Figure 8:
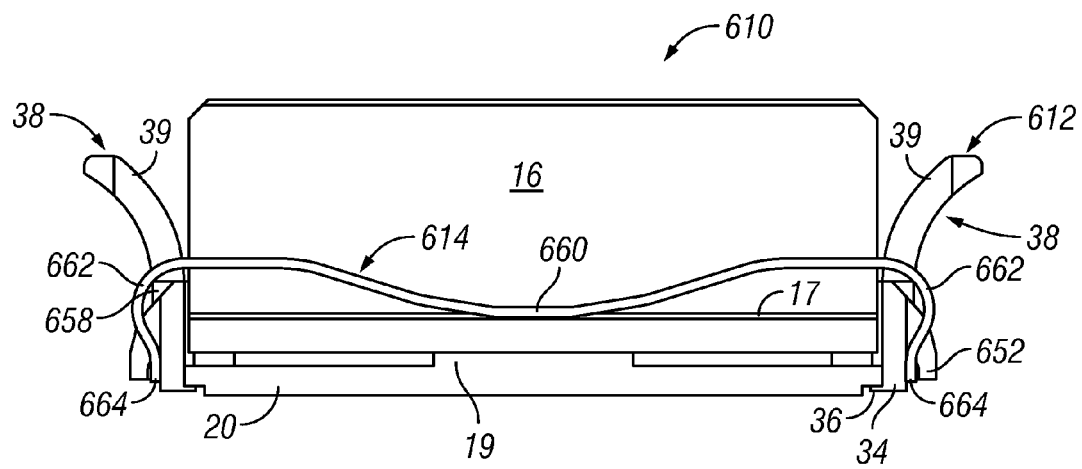
FIG. 8 is a cross sectional view, taken along lines C-C of FIG. 7.

A previously disclosed embodiment of the present invention is a heatsink mounting system shown in an exploded perspective view in FIG. 1 and in other views in FIGS. 2-4 and is referred to herein by the general reference character 10. The presently preferred embodiment of the improved heatsink mounting system is illustrated in FIGS. 6-8, designated by the general reference character 610, and is described further below.

An inventive mounting system 10 is illustrated in the various figures of the drawing and is described below in reference to such figures. The mounting system 10 is in the form of a unitary clip member 12 and a separate spring member 14. In use, the clip member 12 and spring member 14 operate to releasably secure a typical heatsink 16 against a typical IC chip member 18 (such as a CPU) in order to facilitate conductive dissipation of thermal energy from the IC chip 18 into the heatsink 16. The typical IC chip 18 illustrated includes a die portion 19 and a substrate portion 20, with the entire chip 18 being typically mounted on a circuit board (not shown) including numerous other components. The heatsink 16 (a conventional object not an integral part of the invention) has a floor 17 and is further provided with fins 22 which allow the excess thermal energy to dissipate into the environment by radiation and convection.

Figure 5:
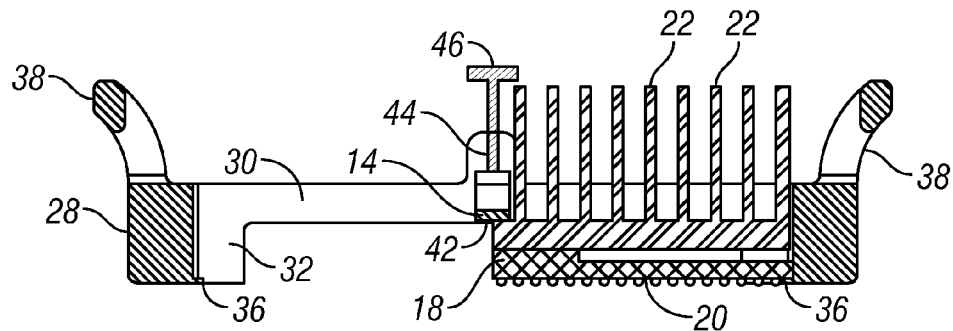
FIG. 5 is a cross-sectional view, taken along line B-B of FIG. 4.

The fully assembled system 10, including the heatsink 16 and chip 18, is shown in FIG. 2 while just the system 10 components (the clip member 12 and the spring member 14) are illustrated in assembled mode in FIG. 3. FIGS. 4 and 5 show the system 10 with the additional elements present on one side of the illustration while they are absent on the other half, as is particularly notable in the cross-sectional view of FIG. 5.

The clip member 12 is preferably an integrally molded component including a number of distinct elements. The clip member 12 is bilaterally symmetrical about a central axis (represented by the bisecting line B-B of FIG. 4 which defines the cross-sectional view of FIG. 5). The clip member 12 may be seen as being a circumferential resilient frame 24 which defines a center cavity 26 in which the IC chip 18 and heatsink 16 are mounted. The resilient frame includes a pair of opposing gripping sides 28 and a pair of opposing lateral sides 30. Corner blocks 32 depend in an "L" shape from the intersections of each pair of sides to define corner positioning retention for the rectangular (square in the preferred embodiment shown) circuit board chip carrier 20.

Grip blocks 34 depend from the center portions of each of the gripping sides 28, extending downward to the same extent as the corner blocks 32. The bottom extent of each grip block 34 which faces the central cavity 26 is also provided with a grip tongue or ledge 36 for engaging the underside of the substrate 20. A pair of opposed grip handles 38 extend upward and curve outward from the upper surfaces of the gripping sides 28, directly above the grip blocks 34. The grip handles 38 include curved posts 39 which cause the handles to extend outward away from the heatsink 16. The curved posts 39 are adapted to roll on the edges of the fins 22 when the grip handles 38 are squeezed together, thus allowing the width of the frame 24 to be minimized. Inward pressure on both grip handles 38 causes torsion in the gripping sides 28 which results in the grip blocks 34 being forced apart, so that the grip tongues 36 spread enough to release the bottom surface of the substrate 20. This facilitates installation and removal of the clip member 12.

In the centers of the lateral sides 30, vertical buttresses 40 are provided, each defining a vertical receiving channel 42; open to the bottom. The vertical receiving channels 42 are adapted to receive and constrain the ends of the spring member 14. Alternate methods of receiving the ends of the spring member 14 are also envisioned, including multiple apertures or through holes at different heights. In the preferred embodiment 10, the receiving channels 42 are of a fixed depth selected for optimal downward pressure on the spring member 14. However, as illustrated in FIGS. 4 and 5, an alternate embodiment envisions threaded apertures 44 in the vertical buttresses 40 for receiving adjusting screws 46. The adjusting screws 46 may be rotated to adjust the downward pressure on the spring member 14 in order to optimize the contact of the heatsink 16 with the upper surface of the IC chip 18. Another potential adjustment mechanism (not shown) is to provide sliding receptors in the channels 42 which may be fixed at different heights.

The previously disclosed spring member 14 is preferably a metal spring strip or wire. The previously disclosed spring member 14 includes a bowed center expanse 48 and a pair of narrower end tips 50. The center expanse 48 is bowed downward to exert resilient pressure upon the heatsink 16. The end tips 50 engage the upper ends of the vertical channels 42 to hold the spring member 14 in position. The spring member 14 is removable and replaceable with interchangeable similarly shaped springs of different tension, for optimizing the amount of pressure applied.

The presently preferred embodiment 610 is illustrated in FIGS. 6-8 and is similar in many respects to the previously disclosed embodiment 10. As is especially apparent from the exploded perspective view of FIG. 6 the ancillary components of the overall system (the heatsink 16 and the chip assembly 18-20) are unchanged, while the majority of the construction of the clip member is also unchanged. However new clip member 612 and recurve spring 614 are significantly different is many respects from clip 12 and spring 14.

The orientation of the assembly is altered in that the recurve spring 614 is aligned to engage the gripping sides 28 rather than the lateral sides 30. Instead of the buttresses 40 with vertical channels 42 situated on the lateral sides 30, the new clip member 612 is provided with a receiving block 652 formed on the exterior of each of the grip blocks 34. Each receiving block 652 has a central channel 654 for receiving the recurve spring 614 and a pair of retention notches 656 adjacent to the lower edge of the central channel 654 (see, especially, FIG. 8). The central portion of each gripping side 28 and the associated grip block 34 is shaped to include an indentation 658 and the upper portion of each receiving block 652 is tapered to facilitate engagement of the recurve spring 614.

As particularly illustrated in the assembled perspective view of FIG. 7 and the cross sectional view of FIG. 8. the recurve spring 614 extends across the new clip member 612 and engages the receiving blocks 652. When assembled on the new clip member 612, the recurve spring 614 places downward pressure on the floor portion 17 of the heatsink 16 to maintain optimal conductive contact with the chip die 19. The recurve spring 614 also provides inward pressure on the gripping sides 28 to secure the clip member 612 against the heatsink 16 and the chip carrier 20.

The recurve spring utilized in the presently preferred embodiment 610 includes a downwardly curved center expanse 660 for engaging the heatsink 16 and a pair of arcical end portions 662 for engaging the central channels 654 of the receiving blocks 652. Each arcical end portion 662 terminates in an end bar 664. A pair of prongs 668 extend laterally outward from each end bar 664 with the prongs 668 being adapted to engage and lock with the retention notches 656 of the corresponding receiving block 652 to hold the recurve spring 614 in position in the assembled presently preferred mounting system 610.

The presently preferred heatsink mounting system 610 is adapted to be delivered to an end user in partially assembled mode. In this mode the new clip member 612, and a heatsink 16 will be held together by the recurve spring 614 gently forcing the heatsink 16 against the grip tongues 36. When the user wishes to install the presently preferred heatsink mounting system 610 onto an IC chip 18, the grip handles 38 are only squeezed together to open the grip clocks 34 once the heatsink 16 engages the chip die 19. At this point the grip tongues 36 release the heatsink 16 and the new clip member 612 is forced down further (with the recurve spring 614 providing significant resistance) until the grip tongues 36 extend below the chip substrate 20. At this point the grip handles 38 are released and the new clip member 612 elastically returns to its normal shape with the grip tongues 36 capturing the IC chip 18. It is noted that the corner blocks 32 prevent any lateral shifting of the heatsink 16 during the operation. In this manner the positioning is optimized and the installation is easily accomplished.

The inventive heatsink mounting system 10 may constructed in varying shapes and with dimensions to match particular types of chip carriers and heatsinks. The square arrangement illustrated is typical of common configurations.

The usually preferred material for forming the clip members 12 and 612 of the heatsink mounting systems 10 and 610 is a resilient heat-resistant plastic such as nylon, PVC, PTFE or fiber glass, although rubber compositions may also work. The spring members 14 and 614 are typically preformed metal strip springs, but may also be formed of metal wire, with the particular metal of alloy selected to provide the desired resiliency. However, other suitable materials, having appropriate properties and structural integrity, may be substituted.

While various embodiments have been described above, it should be understood that these have been presented by way of example only, and not as providing any limitation on the invention.

INDUSTRIAL APPLICABILITY

The presently preferred heatsink mounting system 610 of the present invention is adapted for use in holding heatsink components 16 in optimal conductive contact with electronic components such as IC chips 18. The capacity to easily install and remove the installation, the security of the mounting and the ability to modify the spring pressure are all advantages which make the inventive mounting system 610 desirable.

A typical usage will be in electronic systems where an IC chip or other component generates excess heat during use, which heat must be dissipated for better performance and to avoid degradation. The IC chip 18, usually in the form of a die portion 19 contained in an integral substrate 20, will be secured in position within an enclosed space. The die 19 provides a planar conductive surface presented for abutment against the base portion of a heatsink 16.

The typical heatsink 16 will have a flat floor 17 base portion for fitting conductively against the IC chip die 19 and a plurality of extending fins 22 to dissipate the heat. At least one bisecting cross channel will be provided on the upper surface of the heatsink 16, and in some cases a second bisecting cross channel (as shown in FIGS. 1-5 of the drawings) is also provided so that the fins 22 may be arrayed in two perpendicular configurations. When the assembly is configured for use assembly, including the new clip member 610, the recurve spring 614 and the heatsink 16, is physically placed on the IC chip 18 with the heatsink 16 abutting against the die portion 19 and centered on the substrate 20. The presently preferred mounting system 610 is then manipulated to capture the IC chip 18 as described above, by opening the gripping sides by forcing the grip handles 38 inward toward each other, with the curved posts 39 rolling on the fins 22 in order to elastically rotate the gripping sides 28 such that the grip blocks 34 are forced apart and the grip tongues 36 disengage from the bottom of the heatsink 16. The new clip member 612 is then forced downward until the grip tongues 36 extend below and outside the edge of the chip substrate 20. At this point the squeezing pressure on the grip handles 38 is released and the IC chip 18 is firmly captured in the preferred chip mounting system 610.

The system 10 may be mounted in either orientation if the selected heatsink 16 has perpendicular cross channels. The L-shaped corner blocks 32 enclose the corresponding corners of the heatsink base and thus prevent any lateral shifting during usage. Each of these aspects increases convenience and makes the system 10 have benefits to the typical user.

The mounting systems 10 and 610 are adaptable in that they may be manufactured to custom sizes and shapes to accommodate different types of heatsinks 16. The dimensions and resilience can also be varied during manufacture to alter the strength of the jaws and the force of grip provided. Varying spring members 14 and 614 may be interchanged to modify the pressure applied to the heatsink 16. All of these features make the system adaptable to a multitude of uses.

For the above, and other, reasons, it is expected that the heatsink mounting system of the present invention will have widespread industrial applicability. Therefore, it is expected that the commercial utility of the present invention will be extensive and long lasting.

We claim:

1. A heatsink mounting system for holding a heatsink against a heat generating component, comprising:
a resilient rectangular frame member, including a pair of opposing gripping sides and a pair of opposing lateral sides, said gripping sides each including a depending grip block terminating in an inward extending grip tongue and an opposing grip handle, and further including a receiving block on the exterior surface of said grip block; and
a spring member having an end bar on each for engaging said receiving block, said spring member having a center expanse for engaging an upper surface of the heatsink to hold it in position against the heat generating component;
wherein applying inward pressure against said grip handles forces said frame member to torsion such that said grip tongues are forced apart in order to capture objects such as the heatsink or the heat generating component when said pressure is released.

2. The heatsink mounting system of claim 1, wherein
said receiving blocks include a retention notch for engaging and retaining said end bar.

3. The heatsink mounting system of claim 1, and further including
corner blocks depending from the intersections of said lateral sides and said gripping sides for retaining and position registering said heatsink and said heat generating component.

4. The heatsink mounting system of claim 1, wherein
said gripping sides each include a grip block depending therefrom, each said grip block having a grip tongue projecting therefrom to effect the capture.

5. The heatsink mounting system of claim 1, wherein
said spring member includes a bowed central expanse which arcs in the direction of the floor of the heatsink.

6. The heatsink mounting system of claim 1, wherein
each said grip handle includes a pair of curved posts causing said grip handle to arc away from the interior of said frame.

7. A clip member for mounting and retaining a heatsink against a chip carrier having a heat generating IC chip, comprising:
a rectangular resilient frame having a center cavity for enclosing said heatsink and having depending therefrom;
a pair of opposing grip blocks having grip tongues for capturing said chip carrier and said heatsink thereon;
a grip handle on said frame member directly above each said grip block, said grip handle being manipulable in order to spread said grip blocks apart from said center cavity; and
corner blocks depending from each corner of said frame to laterally restrain and position said heatsink.

8. The clip member of claim 7, wherein:
each said grip handle includes a pair of curved posts arcing away from said center cavity such that inward pressure on said grip handles twists said resilient frame such that said grip tongues are forced apart.

9. The clip member of claim 7, wherein:
said resilient frame includes a pair of opposed gripping sides including said grip blocks depending therefrom and a pair of lateral sides; and
said lateral sides include receiving channels for receiving and capturing the ends of a spring member adapted to extend across said center cavity and to engage said heatsink to resiliently force said heatsink against said IC chip.

10. The clip member of claim 7, wherein:
said resilient frame includes a pair of opposed gripping sides including said grip blocks depending therefrom and a pair of lateral sides; and
said gripping sides include receiving channels for receiving and capturing the ends of a spring member adapted to extend across said center cavity and to engage said heatsink to resiliently force said heatsink against said IC chip.

11. The clip member of claim 10, wherein:
said spring member is a recurve spring and said receiving channels are formed on the exterior surface of said gripping side such that said recurve spring passes through said handles.

\* \* \* \* \*